United States Patent [19]

Dreps et al.

[11] Patent Number: 5,604,466
[45] Date of Patent: Feb. 18, 1997

[54] ON-CHIP VOLTAGE CONTROLLED OSCILLATOR

[75] Inventors: Daniel M. Dreps, Endicott; Raymond P. Rizzo, Vestal, both of N.Y.

[73] Assignee: International Business Machines Corporation, Armonk, N.Y.

[21] Appl. No.: 345,280

[22] Filed: Nov. 28, 1994

Related U.S. Application Data

[63] Continuation of Ser. No. 987,224, Dec. 8, 1992, abandoned.

[51] Int. Cl.⁶ .......................... H03L 7/14; H03K 3/281
[52] U.S. Cl. ............... 331/113 R; 331/186; 331/108 C; 331/176; 331/144; 331/25; 323/907; 323/313; 327/538; 327/539; 333/181
[58] Field of Search ...................... 331/1 A, 1 R, 331/15, 16, 185, 186, 111, 113 R, 144, 108 C, 176, 25; 323/273, 274, 282, 284, 313, 907, 265, 280, 281; 333/181; 327/540, 538, 539, 344

[56] References Cited

U.S. PATENT DOCUMENTS

| | | | |
|---|---|---|---|
| 3,838,564 | 10/1974 | Holcomb | 331/185 X |
| 3,857,110 | 12/1974 | Grebene | 331/108 D |
| 3,983,473 | 9/1976 | Sanderson | 323/22 R |
| 4,015,218 | 3/1977 | Sanderson | 331/111 |
| 4,055,814 | 10/1977 | Abraham et al. | 331/1 A |
| 4,080,780 | 3/1978 | Williams et al. | 307/296 X |
| 4,083,019 | 4/1978 | Hamada et al. | 331/113 R |
| 4,260,945 | 4/1981 | Ahmed | 323/316 |
| 4,492,914 | 1/1985 | Hitomi | 323/313 |
| 4,563,660 | 1/1986 | McNeilly | 333/181 |
| 4,618,837 | 10/1986 | Matsuura | 331/160 |
| 4,623,852 | 11/1986 | Abou et al. | 331/111 |
| 4,663,600 | 5/1987 | Rokos | 331/111 |
| 4,749,961 | 6/1988 | Kato et al. | 331/14 |
| 4,751,463 | 6/1988 | Higgs et al. | 323/314 |
| 4,812,784 | 3/1989 | Chung et al. | 331/113 R |
| 4,843,348 | 6/1989 | Fenk | 331/109 |
| 4,878,151 | 10/1989 | Gallichio | 361/329 |
| 4,916,332 | 4/1990 | Gontowski | 307/296.4 |
| 4,918,404 | 4/1990 | Vitiello et al. | 331/16 |
| 5,079,497 | 1/1992 | Barbu et al. | 323/281 |

OTHER PUBLICATIONS

Operational Amplifiers, Theory & Practice by J. K. Roberge, 1975, p. 521, fig. 12.20.

"Regulated Low Voltage Power Supply with Controllable Temperature Coefficient," by T. C. Verster, Rev. Sci. Instrum., vol. 44, No. 8 Aug. 1973 pp. 1127–1128.

*Primary Examiner*—Robert Pascal
*Assistant Examiner*—Arnold Kinkead
*Attorney, Agent, or Firm*—Jenkens & Gilchrist

[57] ABSTRACT

An on-chip voltage controlled oscillator for use in an analog phase locked loop receives power from a voltage regulator which greatly reduces the noise seen by the voltage controlled oscillator. The voltage controlled oscillator has a DC bias section which supplies a relatively constant current to the multivibrator to assure a minimum operating frequency. A control signal is used to provide additional current which increases the speed of oscillation. The bias current reduces the transfer characteristics (MHz/volt) of the voltage controlled oscillator making it more immune to noise in the control signal.

20 Claims, 4 Drawing Sheets

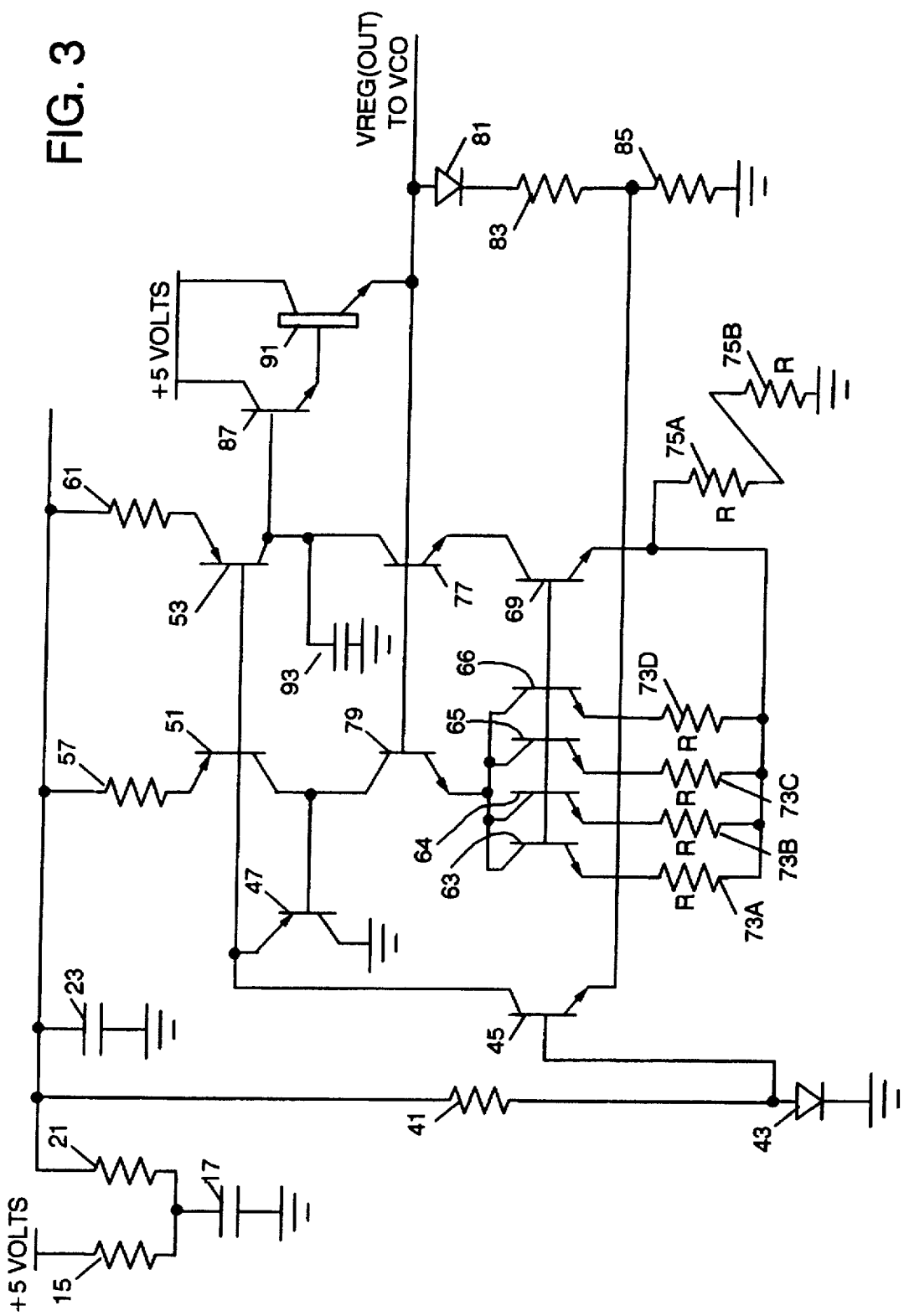

ON-CHIP VOLTAGE CONTROLLED OSCILLATOR

CROSS REFERENCE TO RELATED APPLICATIONS

The application is a continuation of application Ser. No. 07/987,224, filed Dec. 8, 1992, now abandoned. The present invention is related to application Ser. No. 07/988,593 entitled Apparatus and Method to Minimize Near Frequency VCO Interaction in a Serializer Deserializer now U.S. Pat. No. 5,490,282, assigned to the same assignee as the present invention and hereby incorporated by reference.

BACKGROUND OF THE INVENTION

The present invention relates to a voltage controlled oscillator (VCO) circuit suitable for use in a phase locked loop to create an analog phase locked loop with high noise rejection.

On chip VCO's are usually implemented using a multivibrator circuit where the oscillation is controlled by charging and discharging an on-chip capacitor. A common application for such a circuit is in an optical high speed data link, which usually house a serializer VCO and a deserializer VCO on the same module. These VCO's are especially sensitive to power supply noise, other VCO's and data patterns which have the same frequency component as the VCO operating frequency but are asynchronous with each other. This type of noise is referred to as near frequency noise. Enough noise of this kind can override the control voltage input to the VCO and cause the phase locked loop, of which the VCO is a part, to lose phase lock. Noise which contains odd harmonic frequencies of the fundamental will also affect the VCO although the sensitivity is not as dominant as the fundamental frequency.

A previous approach to reduce noise sensitivity was to use passive filtering techniques to filter the high frequency noise using R,L,C networks on the module or external to the module. This approach does not have full frequency band rejection and uses a large number of components.

Another approach is to use a digital phase locked loop, which inherently has better noise immunity. For applications such as high speed (gigahertz) clock recovery the digital phase locked loop cannot be implemented at the speeds desired with present CMOS technology.

It is an object of the present invention to provide a noise immune VCO that can be implemented on-chip and which can supply sufficient transient current and unimpaired AC performance.

It is a further object of the present invention to provide a VCO for use in an analog phase locked loop which is tolerant of near frequency noise.

It is another object of the present invention to provide a VCO for use in an analog phase locked loop which is more tolerant of harmonic noise injected into the power supply of the VCO from other external circuits, acting as noise sources.

SUMMARY OF THE INVENTION

In one aspect of the present invention a voltage controlled oscillator circuit is provided including an oscillator providing an output frequency responsive to a control signal having a minimum frequency clamp to assure operation of the multivibrator at all times. A supply voltage regulator provides a supply voltage to the oscillator. The supply voltage regulator includes a temperature compensated reference voltage and a a regulator loop. The regulator loop includes means for providing adequate current to maintain the regulated voltage. The means for providing adequate current has a first terminal connected to the input of the supply voltage regulator, a second terminal connected to the output of the supply voltage regulator, and a third terminal serving as a control terminal. The regulator loop is responsive to the temperature compensated reference and the supply voltage regulator output voltage. The regulator loop controls the control terminal of the means for providing adequate current at the regulated voltage, so that the series voltage regulator can maintain a constant output voltage. Passive filter means is connected to the input of the supply voltage regulator. The passive filter means removes noise from the supply voltage regulator input having frequencies higher than the regulator loop can respond to, the output of said passive filter means providing power to the regulator loop.

In another aspect of the present invention a voltage controlled oscillator is provided including a multivibrator having first and second switching transistors which are turned on and off, with the transistor being in opposite states relative to one another, responsive to a control current. Capacitor means are connected to the first and second switching transistors to be charged and discharged by the first and second switching transistors, when the switching transistors turn on and off. A variable control current signal varies the charging and discharging current in the capacitor means responsive to an input voltage signal which is coupled to the multivibrator. A fixed current for charging and discharging the capacitor means, maintains a minimum multivibrator frequency thereby assuring operation of the multivibrator even in the absence of the variable control current.

BRIEF DESCRIPTION OF THE DRAWINGS

FIG. 3 shows a schematic representation of an integrated circuit embodiment of the voltage regulator of FIG. 1.

DETAILED DESCRIPTION OF THE INVENTION

Figure 1:
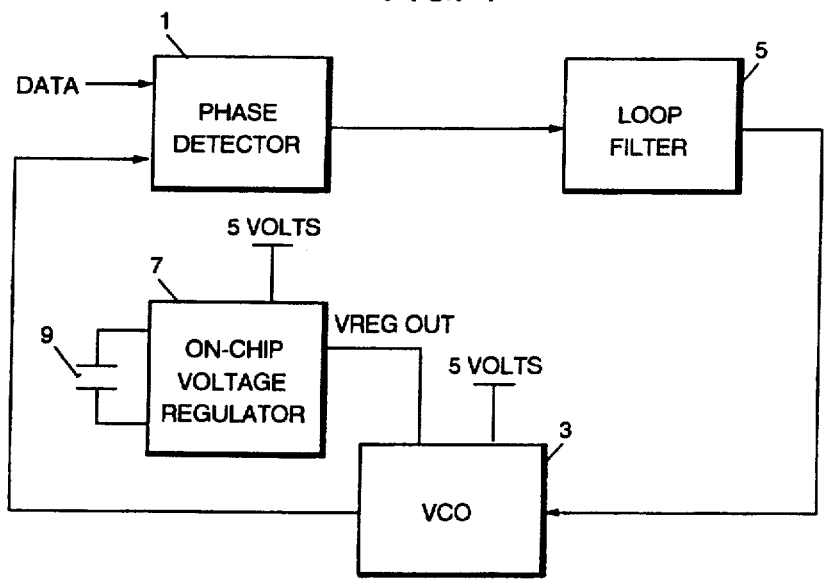
FIG. 1 is a block diagram of an analog phase locked loop with a voltage regulator supplying the VCO in accordance with one aspect of the present invention.

Referring now to the drawing wherein like numerals indicate like elements throughout and particularly FIG. 1 thereof, an analog phase locked loop (PLL) is shown comprising a phase detector 1, which compares the frequency of an input signal to an output signal provided by a voltage controlled oscillator (VCO) 3 and generates a phase error signal. The phase error signal is provided to a loop filter 5 which provides a control signal to the VCO 3. The output frequency of the VCO is controlled by the control signal from the loop filter 5. Therefore, the PLL loop synchronizes the output signal provided by the VCO with the input signal, labelled data, in frequency as well as in phase. When the two signals are synchronized or locked, the phase error between the VCO output and the data signal is very small or zero. An on-chip voltage regulator 7 with an on module capacitor 9 is supplied by a power supply and provides a regulated voltage to the VCO 3. The PLL can be implemented as a conventional continuous time phase locked loop or a current charge pump (not shown) can be situated between the phase detector 1 and the loop filter 5. The charge pump provides an open circuit state to isolate the loop filter from the charge pump enabling a zero static phase error at steady state.

Figure 2:
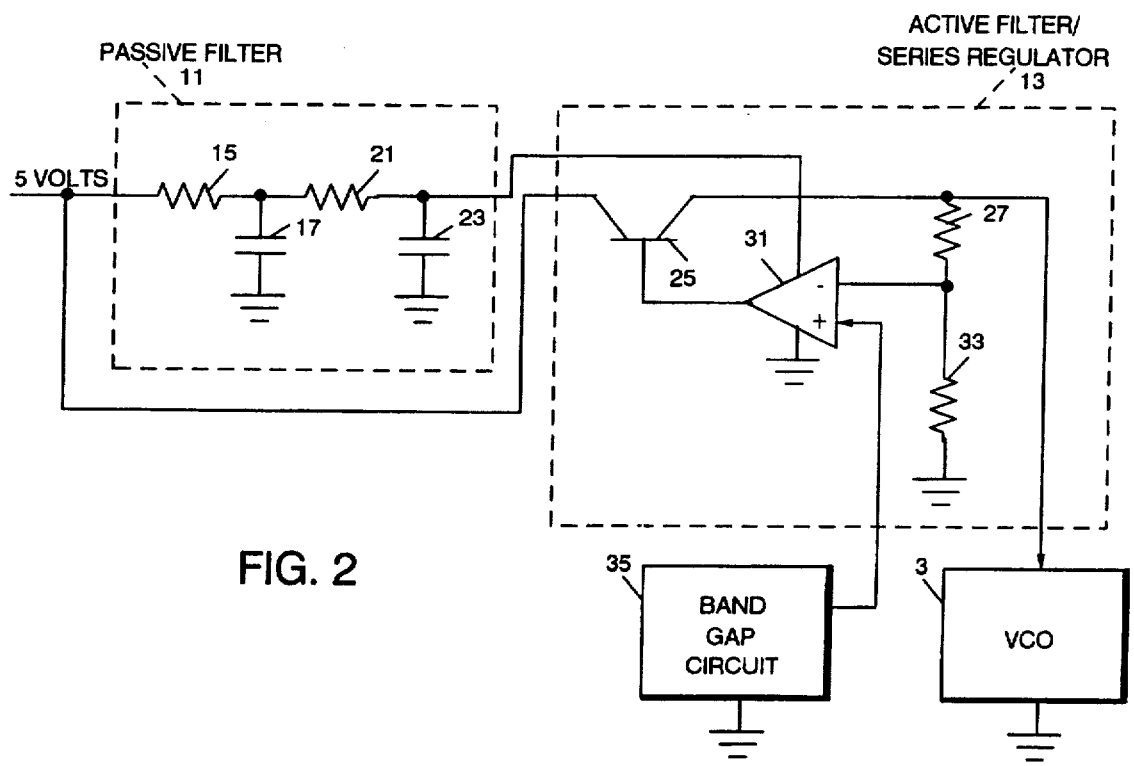
FIG. 2 is a high level part schematic part block diagram of a discrete embodiment of the voltage regulator of FIG. 1.

Referring now to FIG. 2, an embodiment of a voltage regulator is shown. A passive filter shown as two L section filters 11 is shown connected to an active filter/series regulator 13. The L section filters comprise resistors 15, 21, with one end of the resistors serving as the input of the filter and the other end connected through capacitors 17 and 23 to ground. The junction of capacitor 23 and resistor 21 is the output of the filter. The active filter series regulator 13 includes an npn transistor 25 which has its collector connected to the 5 volt supply and its emitter connected through a resistor to the inverting input of an operational amplifier 31 and through a resistor 33 to ground. The passive filter 11 supplies power to the operational amplifier 31. The active filter/series regulator further includes a temperature compensated reference circuit shown as a band gap circuit 35 which provides the reference voltage to the noninverting input of the operational amplifier 31. The voltage divider comprised of resistors 27 and 33 allows a voltage greater than the band gap reference voltage to be regulated. The output of the operational amplifier is connected to the base of the transistor 25. The output of the active filter/series regulator provides a supply voltage to the VCO 3.

In operation, the power supply voltage is filtered by a passive filter comprising resistors 15 and 21 and capacitors 17 and 23. Resistor 15 and capacitor 17 provide high frequency attenuation filtering at frequencies above the response ability of the voltage regulator, since most regulators fail to reject input noise as frequencies increase due to loop roll off limitations. Resistor 21 and capacitor 23 provide an additional high frequency attenuation break for the circuit. The output of the passive filter is used to provide power to the operational amplifier 31. The unfiltered power supply signal is provided to the series pass element 25. The series pass element does not have any voltage gain and also presents a high impedance to its input, so that noise is not passed to the output. The operational amplifier 31, the base and emitter of npn transistor 25 and resistors 27 and 33 form a regulation loop. The operational amplifier 31 compares a signal proportional to the voltage regulator output to the output of the band gap circuit. The operational amplifier output controls the pass element so that sufficient current is supplied to the VCO.

Referring now to FIG. 3 an embodiment of the voltage regulator which drives the VCO 3 is shown which is suitable for implementation as an integrated circuit. Passive filtering is provided to the power supply voltage which is connected to one end of resistor 15. The other end of resistor 15 connected through capacitor 17 to ground and through series connected resistor 21 and capacitor 23 to ground. A resistor 41 is connected at one end to the junction of resistor 21 and capacitor 23, to the anode of a diode 43, and through diode 43 to ground. An npn transistor 45 has its base connected to the anode of diode 43. The collector of transistor 45 is connected to the emitter of pnp transistor 47 and to the base of pnp transistor 51 and to the base of pnp transistor 53. The base of transistor 47 is connected to the collectors of pnp transistor 51 and npn transistor 79. The collector of transistor 47 is connected to ground. Resistors 57 and 61 are both connected at one end to the junction of resistors 21 and capacitor 23. Resistors 57 and 61 are connected at the other end to the emitters of transistor 51 and transistor 53, respectively. The emitter of transistor 45 is connected to the emitter of four parallel connected npn transistors 63, 64, 65, and 66. The bases of transistors 63, 64, 65, and 66 are connected to the base of npn transistor 69. Four parallel connected resistors 73A, 73B, 73C, and 73D are connected between the emitters of transistors 63, 64, 65, and 66, and the emitter of transistor 69. The emitter of transistor 69 is connected through series connected resistors 75A and 75B to ground. Resistors 73A, 73B, 73C, 73D, 75A, and 75B all have the same resistance value and physical aspect ratio (length to width). The collector of transistor 53 is connected to the collector of npn transistor 77. The base of the transistor 77 is connected to the base of transistor 79 and to the anode of diode 81. The cathode of diode 81 is connected through series connected resistors 83 and 85 to ground. The base of transistor 69 is connected to the junction of resistors 83 and 85. An npn transistor 87 has its emitter connected to the base of a driver npn 91. The collectors of transistors 87 and 91 are connected to the power supply voltage. The base of transistor 87 is connected through a capacitor 93 to ground and to the junction of collectors of transistors 53 and 77.

Figure 4:
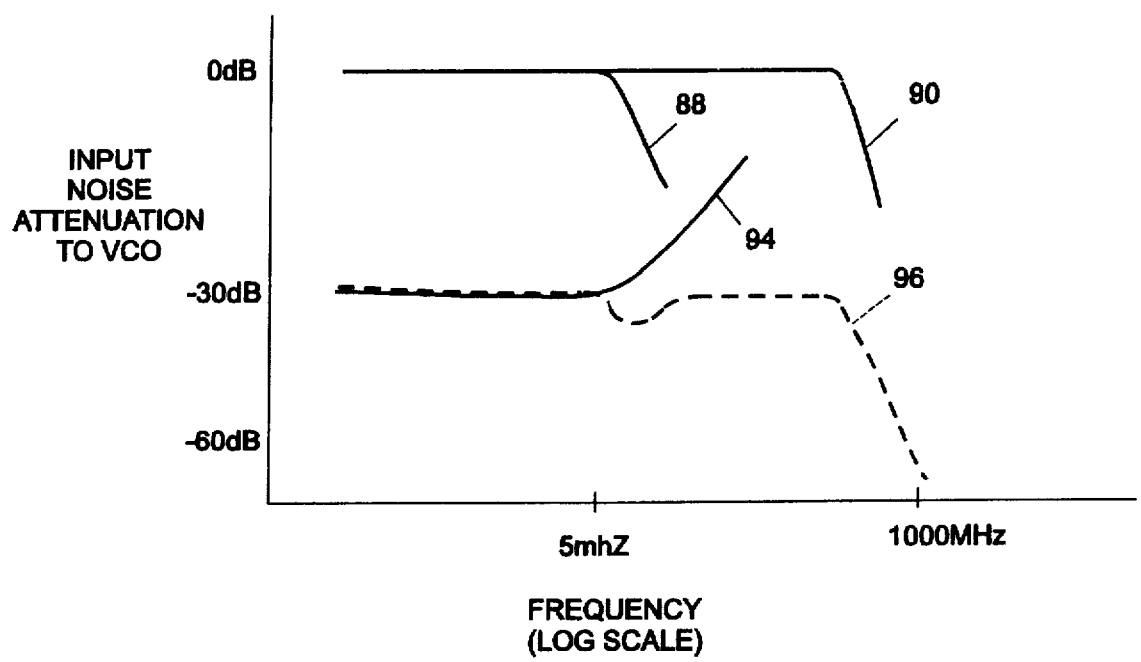
FIG. 4 is a graph showing the input noise attenuation due to passive and active filtering of the voltage supplied to the voltage controlled oscillator versus a logarithmic frequency scale.

In operation, the power supply voltage is filtered by a passive filter comprising resistors 15 and 21 and capacitors 17 and 23. Resistor 15 and capacitor 17 provide high frequency attenuation filtering at frequencies above the response ability of the voltage regulator, since most regulators fail to reject input noise as frequencies increase due to loop roll off limitations. Resistor 21 and capacitor 23 provide an additional high frequency attenuation break for the circuit. Resistor 15 and 21 are typically on the order of 100–300 ohms to limit the voltage drop. Capacitor 17 is a relatively high value, about 50,000 picofarads, on module capacitor. When power is initially provided to the circuit, transistor 45 turns on and then turns off as transistor 47 begins to conduct and sink base current for the current mirror formed by matched transistors 51 and 53. The current mirrors provide current to a band gap reference which maintains a fixed voltage at the bases of transistors 63, 64, 65, 66, and 69, all of which are the same type of transistor. The emitter area of the parallel combination of 63, 64, 65, and 66 is four times that of transistor 69. The output of the band gap reference circuit is available at the anode of diode 81. Diode 81 provides the negative temperature coefficient to balance the positive temperature coefficient set by the two current densities and the resistor values of resistors 83 and 85. In the present embodiment the resistors are implemented using polysilicon which has nominally a zero temperature coefficient. If resistors with positive temperature coefficients are available they can be used instead of the diode 81 to provide temperature compensation in the band gap circuit. The voltage VREG is therefore a stable DC level insensitive to temperature and power supply variations. Transistors 79 and 77 are provided to clamp the collectors of transistors 63, 64, 65, and 66, and 69. By clamping the collectors, the Early effect (slight changes in Vbe with changes in collector voltage) is eliminated. Transistors 79 and 77 transfer the current from the mirror through to the transistors in the band gap reference. The Darlington pair 87 and 91 provide current needed to the load. Capacitor 93 is a loop stability capacitor. Capacitor 23 and 93 are located on the chip and preferably have a high Q as obtained by using MOSCAP capacitors which have a low series resistance. Input noise is therefore rejected over a large frequency range by both active and passive filtering, implemented by both the low frequency rejection capability of the voltage regulator and the two L section passive filters. FIG. 4 shows the noise rejection due to resistor 15 and capacitor 17 labelled by reference numeral 88 and by resistor 21 and capacitor 23 labelled by reference numeral 90. The input noise attenuation provided by the active filter which results from the regulator circuit operation is shown by the curve labelled by reference numeral 94. The composite curve showing the attenuation due to active and passive filtering is shown by the curve labelled by reference numeral 96.

The circuit of FIG. 3 is arranged in a double boot strap configuration with two interacting loops. There is a band gap reference loop and a regulation loop. The band gap reference loop includes the bases and collectors of pnp transistors 51 and 53, transistors 63, 64, 65, 66, 69, and 77 and 79. The regulation loop includes transistors 69, 77, 87 and 91, diode 81, and resistor 83. The regulation loop steps up the reference voltage from the band gap circuit from about 1.2 volts at the base of transistor 69 to about 2.8 volts at the anode of diode 81. The band gap loop provides a small current which changes based on changes in the voltage at the anode of the diode, to the base of the Darlington pair. The current supplied from the band gap loop is sufficiently small to avoid interference with band gap loop operation. The unfiltered power supply voltage that is provided to the Darlington pair does not allow noise from the power supply to affect the regulated output since the Darlington collector presents a high impedance to the noise and acts as a buffer.

Figure 5:
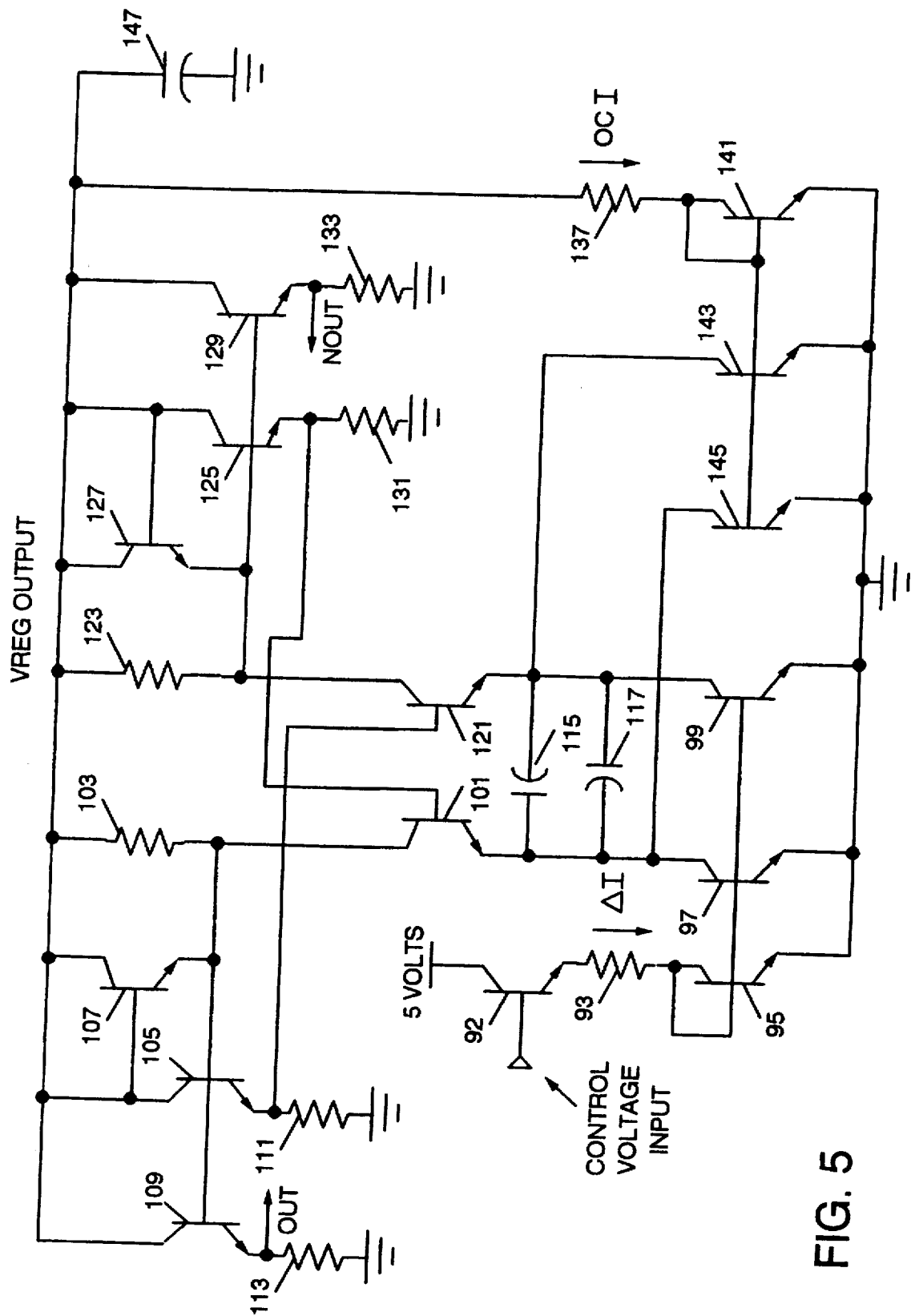
FIG. 5 shows a schematic representation of the VCO of FIG. 1 in more detail.

Referring now to FIG. 5, voltage controlled oscillator 3 made on a common substrate is shown. The VCO is implemented as a voltage controlled emitter coupled multivibrator in which the charging currents of the capacitors is varied in response to a control input. The multivibrator receives a control input voltage at the base of npn transistor 92. The collector of transistor 92 is connected to the supply voltage of the chip while the emitter is connected through a resistor 93 to the multiple output current mirror formed by npn transistors 95, 97, and 99. The base of transistor 95 is connected to the collector of transistor 95 and to the bases of transistors 97 and 99. The emitters of transistors 95, 97, and 99 are connected to to one another and to ground. The collector of transistor 97 is connected to the emitter of npn transistor 101. The collector of transistor 101 is connected through a resistor 103 to the regulated voltage output VREG. The collectors of npn transistors 105, 107, and 109 are connected to the regulated voltage VREG. The collector of transistor 107 is connected to its base. The emitter of transistor 107 and the bases of transistors 105 and 109 are connected to one another, as well as to the collector of transistor 101. The emitter of transistor 105 is connected through a resistor 111 to ground. The emitter of transistor 109 is connected through a resistor 113 to ground.

The collector of transistor 99 is connected to the emitter of npn transistor 121. The emitters of transistors 101 and 121 are connected to either end of two parallel capacitors 115 and 117. Two capacitors in parallel are used since the capacitors do not provide symmetrical input impedance when looking into the capacitor from different sides. By using two capacitors of the same type connected together with the top plate of one connected to the bottom plate of the other a more symmetrical capacitance is obtained. Capacitors 115 and 117 are the same type of MOSCAPs used in the voltage regulator capacitors 23 and 93 of FIG. 3. The collector of transistor 121 is connected through a resistor 123 to the regulated voltage output VREG. The collectors of npn transistors 125, 127, and 129 are connected to the regulated voltage VREG. The collector of transistor 127 is connected to its base. The emitter of transistor 127 and the bases of transistors 125 and 129 are connected to one another, as well as to the collector of transistor 121. The emitter of transistor 125 is connected through a resistor 131 to ground. The emitter of transistor 129 is connected through a resistor 133 to ground.

The VCO has a DC bias section which supplies a relatively constant current which includes a resistor 137 connected at one end to the voltage VREG and the other end connected to the collector of an npn transistor 141, which is the programming transistor of a multiple output current mirror which further includes npn transistor 143 and 145. To enhance tracking during the operation of the multivibrator npn transistors 95, 97, 99, 141, 143, and 145 are preferably configured as low noise multi-stripe npn's. The multi-stripe refers to the use of additional stripes beyond the normal three stripes for the base, collector, and emitter and connecting these additional stripes in parallel with the existing stripes to achieve a lower noise device. The collector of transistor 141 is connected to the bases of transistors 143 and 145. The emitters of transistors 141, 143, and 145 are connected to ground. The collector of transistor 143 is connected to the collector of transistor 99. The collector of transistor 145 is connected to the collector of transistor 97. A MOSCAP 147 is connected one end to the collector of transistor 129 and the other end to ground. Capacitor 147 represents the distributed MOS capacitance around the VCO layout.

The operation of the voltage controlled emitter coupled multivibrator of FIG. 5 will now be described. Assume that transistor 101 is turned off and transistor 121 is turned on. Current flows through diode connected transistor 127 with the base of transistor 125 one diode drop below VREG, the emitter of transistor 125 two diode drops below VREG, and the base of transistor 101 two diode drops below VREG. Neglecting the base current in transistor 105, the base is at VREG, and its emitter is one diode drop below VREG. Since transistor 101 is off, a current determined by the control voltage input which drives the transistor 92 connected as an emitter follower, controls the current in the programming transistor 95 in the multiple output current mirror, causing the current delta I to charge the parallel combination of capacitor 115 and capacitor 117 so that the emitter of transistor 101 becomes more negative. In addition a DC bias current through resistor 137 labeled "DC" I is supplied to programming transistor 141 of the multiple current mirror which results in the DC bias current also flowing in the parallel capacitors 115 and 117 making them more negative. Capacitor 147 provides transient current to the VCO. Transistor 101 will be fully turned on when the voltage at its emitter becomes equal to two diode drops below VREG. When transistor 101 turns on, the resulting collector current in transistor 101 turns on transistor 107. As a result, the base of transistor 105 moves in the negative direction by one diode drop causing the base of transistor 121 to move in the negative direction by one diode drop. Transistor 121 will turn off, causing the base of transistor 101 to move positive by one drop since transistor 127 stops conducting. As a result, the emitter-base junction of transistor 121 is reverse biased by one diode drop because the voltage across the capacitors cannot change instantaneously. Current from transistor 101 now must charge the parallel capacitors in the negative direction by an amount equal to two diode drops before the circuit will switch back again. The bases of transistors 109 and 129 provide square waves which change amplitude when transistors 101 and 121 switch. Transistors 109 and 129 which are connected as emitter followers serve as buffers and provide the output of the oscillator at their emitters. An output which is inverted with respect to the output of transistor 129 is available at the emitter of transistor 109.

Figure 6:
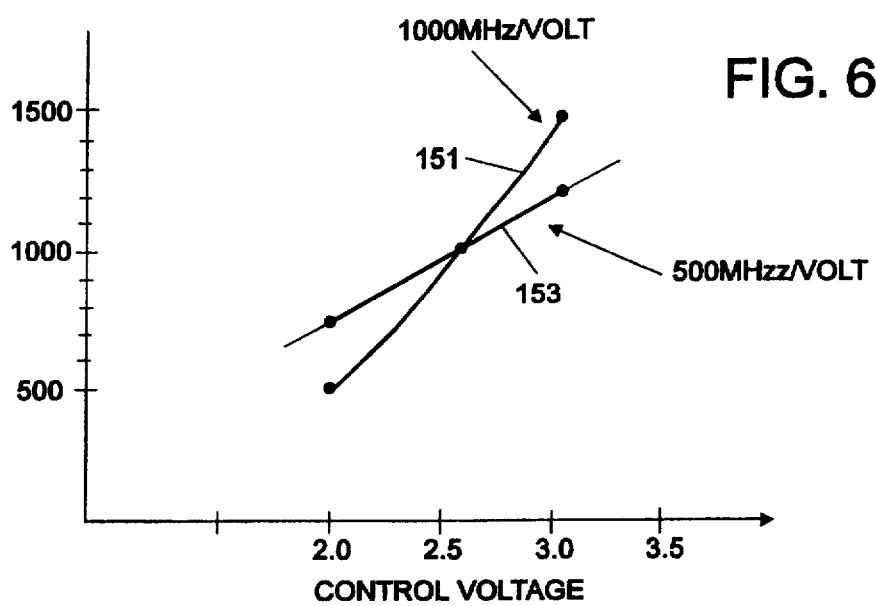
FIG. 6 is a graph showing the small signal phase locked loop gain around the operating point in MHz/volt versus the control voltage of the VCO with and without the use of a DC bias current in the VCO.

The DC bias current assures that no matter how low the control input current goes the multivibrator will oscillate. The DC bias current also assures the multivibrator will operate during start up. The magnitude of the DC bias current is set to achieve a frequency of about half the normal frequency. In addition, the presence of the DC bias current modifies the transfer characteristic measured in megahertz of output frequency per volt of control voltage of the VCO making the VCO less sensitive to noise, see FIG. 6. The slope of the transfer characteristic when a DC bias current is not used is shown in the curve indicated by reference numeral 151 and this slope is greater than the slope in the curve indicated by reference numeral 153 which represents the transfer characteristic when the DC bias current is used as shown in FIG. 5.

By configuring the design on a common substrate integrated circuit, close initial part tolerances and good temperature tracking between similar type devices is achievable. With close tolerances between physically identical repeated devices located next to each other, symmetric output pulses from the VCO can be guaranteed. Devices which need to be matched to guarantee symmetry are transistors 97 and 99, and transistors 143 and 145 since these transistors produce the currents drawn from capacitors 117 and 115, which sets the frequency of the VCO and the symmetry between the up and down output pulses supplied by the VCO. Mismatches in the devices would cause symmetry mismatches and would not allow the VCO to be used for an accurate half speed clock which is required in certain applications.

The foregoing has described a VCO for use in an analog phase locked loop which is more tolerant of harmonic noise injected into the power supply of the VCO from other external circuits, acting as noise sources.

While the invention has been particularly shown and described with reference to a preferred embodiment thereof, it will be understood by those skilled in the art that various changes in form and details may be made therein without departing from the spirit and scope of the invention.

What is claimed is:

1. A circuit comprising:

a voltage regulator for rejecting low frequency noise from a regulated power supply, the voltage regulator including a voltage regulator output for providing a noise-attenuated regulated voltage; and an oscillator, the voltage regulator and the oscillator implemented on a common substrate, the oscillator coupled to the voltage regulator output, the voltage regulator further including attenuation means, which attenuation means includes a passive filter coupled to the regulated power supply for attenuating high frequency noise from the regulated power supply, and for supplying power from the power supply to the voltage regulator, wherein the passive filter includes a first resistor-capacitor pair for attenuating noise frequencies higher than a response ability of the voltage regulator, wherein the noise frequencies are higher than about 5 MHz, the passive filter further including a second resistor-capacitor pair for attenuating noise frequencies higher than about 800 MHz, wherein the attenuation means further includes means for maintaining an attenuation of at least about −30 dB for noise frequencies in a range from about DC to at least about 800 MHz, wherein the voltage regulator further includes a band gap circuit and regulator means for providing adequate current to maintain the regulated voltage while preventing noise from passing through the regulator means to the voltage regulator output, the regulator means including a Darlington pair coupled to the voltage regulator output, and a control terminal of the Darlington pair coupled to the band gap circuit for receiving variable current, the band gap circuit coupled to the voltage regulator output and controlling the variable current in response to changes in the regulated voltage, wherein the oscillator comprises a multivibrator which includes a control voltage input, and capacitors connected in parallel, wherein a top plate of one of the capacitors is connected to a bottom plate of another one of the capacitors for providing a symmetric capacitance, and further wherein the control voltage input comprises a first transistor for receiving a control voltage signal, the first transistor coupled to the regulated power supply and to one end of a resistor, another end of the resistor coupled to both a collector and a base of a second transistor, the second transistor coupled to a plurality of transistors to form a multiple output current mirror, the multiple output current mirror coupled to the capacitors connected in parallel.

2. The circuit according to claim 1, wherein the attenuation means further includes an active filter means, the combination of the passive filter and the active filter means for attenuating noise frequencies in a range from about DC to at least about 800 MHz.

3. The circuit of claim 1, wherein:

the second transistor and the plurality of transistors are all coupled together through their bases;

the plurality of transistors includes a third transistor having a collector coupled to one end of the capacitors connected in parallel, and a fourth transistor having a collector coupled to another end of the capacitors connected in parallel; and the second, third, and fourth transistors are all coupled to ground.

4. The circuit of claim 3, wherein the multivibrator further includes:

a pair of switching transistors coupled to opposite ends of the capacitors connected in parallel; and wherein the oscillator further comprises:

two outputs each for providing a square wave output which is inverted in relation to the other square wave output, the two outputs each including:

an output transistor having a collector coupled to the voltage regulator output, a base of the output transistor coupled to one of the pair of switching transistors, and an emitter of the output transistor coupled to ground through an output resistor, the emitter of the output transistor providing the square wave output which is inverted in relation to the other square wave output.

5. The circuit of claim 4, wherein the oscillator further comprises:

a DC bias circuit including a second resistor having one end coupled to the voltage regulator output and a second end coupled to a second multiple output current mirror, which second multiple output current mirror is coupled to the capacitors connected in parallel, for supplying a minimum current to the second current mirror for maintaining a minimum oscillation frequency of the multivibrator during an absence of a voltage signal at the control voltage input.

6. The circuit of claim 5, wherein the second multiple output current mirror comprises:

a fifth transistor having a collector coupled to said one end of the capacitors connected in parallel;

a sixth transistor having a collector coupled to said another end of the capacitors connected in parallel;

a seventh transistor having its collector and base coupled to the second resistor; and wherein the fifth, sixth, and seventh transistors are all coupled together through their bases and are all coupled to ground through their emitters.

7. The circuit of claim 1, wherein the circuit is implemented in an analog PLL, which PLL includes a phase detector coupled to an output of the oscillator and to a signal source.

8. The circuit according to claim 1, wherein the voltage regulator output is coupled to ground through a temperature responsive diode and two resistors, the temperature responsive diode and two resistors all connected in series, for providing a consistent temperature compensated regulated voltage.

9. A circuit comprising:

a voltage regulator coupled to a power supply and including a voltage regulator output for providing a regulated voltage, wherein the voltage regulator includes a passive filter coupled to the power supply for attenuating high frequency noise, the passive filter including a first resistor-capacitor pair for attenuating noise frequencies higher than a response ability of the voltage regulator and a second resistor-capacitor pair for attenuating noise frequencies higher than about 800 MHz; and an oscillator, the voltage regulator and the oscillator being implemented on a common substrate, the oscillator coupled to the voltage regulator output, wherein the oscillator comprises a multivibrator which includes a control voltage input and capacitors connected in parallel, wherein a top plate of one of the capacitors is connected to a bottom plate of another one of the capacitors for providing a symmetric capacitance, and further wherein the control voltage input comprises a first transistor for receiving a control voltage signal, the first transistor coupled to the power supply and to one end of a resistor, another end of the resistor coupled to both a collector and a base of a second transistor, the second transistor coupled to a plurality of transistors to form a multiple output current mirror, the multiple output current mirror coupled to the capacitors connected in parallel.

10. The circuit of claim 9, wherein:

the second transistor and the plurality of transistors are all coupled together through their bases;

the plurality of transistors includes a third transistor having a collector coupled to one end of the capacitors connected in parallel, and a fourth transistor having a collector coupled to another end of the capacitors connected in parallel; and the second transistor and the plurality of transistors are all coupled to ground.

11. The circuit of claim 10, wherein the multivibrator further includes:

a pair of switching transistors coupled to opposite ends of the capacitors connected in parallel; and wherein the oscillator further comprises:

two outputs each for providing a square wave output which is inverted in relation to the other square wave output, the two outputs each including:

an output transistor having a collector coupled to the voltage regulator output, a base of the output transistor coupled to one of the pair of switching transistors, and an emitter of the output transistor coupled to ground through a second resistor, the emitter of the output transistor providing the square wave output which is inverted in relation to the other square wave output.

12. The circuit of claim 11, wherein the oscillator further comprises:

a DC bias circuit including a second resistor having one end coupled to the voltage regulator output and a second end coupled to a multiple output current mirror, which multiple output current mirror is coupled to the capacitors connected in parallel, for supplying a minimum current to the current mirror for maintaining a minimum oscillation frequency of the multivibrator during an absence of a voltage signal at the control voltage input.

13. The circuit of claim 12, wherein the multiple output current mirror comprises:

a fifth transistor having a collector coupled to said one end of the capacitors connected in parallel;

a sixth transistor having a collector coupled to said another end of the capacitors connected in parallel;

a seventh transistor having its collector and base coupled to the second resistor; and wherein the fifth, sixth, and seventh transistors are all coupled together through their bases and are all coupled to ground through their emitters.

14. The circuit of claim 13, wherein the third and fourth transistors, and the fifth and sixth transistors each consist of a pair of matched transistors, each pair of matched transistors coupled to opposite ends of the capacitors connected in parallel for providing symmetric square wave pulses at each of said two outputs.

15. A circuit comprising:

a voltage regulator coupled to a power supply and including a voltage regulator output for providing a regulated voltage, wherein the voltage regulator includes a passive filter coupled to the power supply for attenuating high frequency noise, the passive filter including a first resistor-capacitor pair for attenuating noise frequencies higher than a response ability of the voltage regulator and a second resistor-capacitor pair for attenuating noise frequencies higher than about 800 MHz; and an oscillator, the voltage regulator and the oscillator being implemented on a common substrate, the oscillator coupled to the voltage regulator output, wherein the oscillator comprises a multivibrator which includes a control voltage input and capacitors connected in parallel, wherein a top plate of one of the capacitors is connected to a bottom plate of another one of the capacitors for providing a symmetric capacitance, and wherein the oscillator further comprises a DC bias circuit including a resistor having one end coupled to the voltage regulator output and a second end coupled to a multiple output current mirror, which multiple output current mirror is coupled to the capacitors connected in parallel, for supplying a minimum current to the current mirror for maintaining a minimum oscillation frequency of the multivibrator during an absence of a voltage signal at the control voltage input.

16. The circuit of claim 15, wherein the multiple output current mirror comprises:

a first transistor coupled to one end of the capacitors connected in parallel;

a second transistor coupled to another end of the capacitors connected in parallel;

a third transistor having its collector and base coupled to the resistor; and wherein the first, second, and third transistors are all coupled together through their bases and are all coupled to ground through their emitters.

17. The circuit of claim 15, wherein the DC bias circuit further includes means for lessening the noise sensitivity of the oscillator by improving its transfer characteristic by about 500 MHz of output frequency per volt of the control voltage signal.

18. The circuit of claim 10, wherein the oscillator comprises a maximum number of diode voltage drops from the voltage regulator output to ground, the maximum number of diode voltage drops equal to four.

19. The circuit of claim 9, wherein the circuit is implemented in an analog PLL, which PLL includes a phase detector coupled to an output of the oscillator and to a signal source.

20. A phase locked loop comprising:

a regulated power supply;

a phase detector including means for receiving a signal;

a loop filter coupled to the phase detector for receiving a phase detector output;

a VCO coupled to the regulated power supply and to the loop filter for receiving a loop filter output, the VCO providing a voltage controlled output to the phase detector in response to the loop filter output; and a voltage regulator coupled to the regulated power supply and to the VCO for rejecting low frequency noise from the regulated power supply and for providing a noise-attenuated regulated voltage to the VCO;

the voltage regulator and the VCO implemented on a common substrate;

wherein, the voltage regulator comprises:

active filter means for attenuating low frequency noise;

a first resistor-capacitor pair for attenuating noise frequencies higher than a response ability of the active filter means;

a second resistor-capacitor pair for attenuating noise frequencies higher than about 800 MHz;

a band gap circuit;

regulator means for providing adequate current to maintain the regulated voltage while preventing noise from passing through the regulator means to the VCO, the regulator means including:

a Darlington pair coupled to the regulated power supply, an output of the Darlington pair coupled to the VCO, and a control terminal of the Darlington pair coupled to the band gap circuit for receiving variable current, the band gap circuit coupled to the VCO and controlling the variable current in response to changes in the regulated voltage;

further wherein the VCO comprises a multivibrator which includes a control voltage input and capacitors connected in parallel, wherein a top plate of one of the capacitors is connected to a bottom plate of another one of the capacitors for providing a symmetric capacitance, and further wherein the control voltage input comprises a first transistor for receiving a control voltage signal, the first transistor coupled to the power supply and to one end of a resistor, another end of the resistor coupled to both a collector and a base of a second transistor, the second transistor coupled to a plurality of transistors to form a multiple output current mirror, the multiple output current mirror coupled to the capacitors connected in parallel.

\* \* \* \* \*